United States Patent [19]
Hwang

[11] Patent Number: 5,516,605
[45] Date of Patent: May 14, 1996

[54] PHOTO MASK PROVIDED WITH DEVELOPMENT RATE MEASURING PATTERN AND METHOD FOR MEASURING DEVELOPMENT RATE UNIFORMITY

[75] Inventor: Joon Hwang, Bubaleub, Rep. of Korea

[73] Assignee: Hyundai Electronics Industries Co., Ltd., Kyoungkido, Rep. of Korea

[21] Appl. No.: 344,891

[22] Filed: Nov. 25, 1994

[30] Foreign Application Priority Data

Nov. 25, 1993 [KR] Rep. of Korea ............... 1993-25301

[51] Int. Cl.⁶ ...................................................... G03F 9/00
[52] U.S. Cl. ...................... 430/5; 430/22; 430/30; 430/312; 430/327
[58] Field of Search ............................ 430/5, 22, 30, 430/312, 327

[56] References Cited

U.S. PATENT DOCUMENTS 5,087,537  2/1992  Conway et al. ...................... 430/22

*Primary Examiner*—S. Rosasco
*Attorney, Agent, or Firm*—Merchant, Gould, Smith, Edell, Welter & Schmidt

[57] ABSTRACT

A photo mask including a development rate measuring pattern having a plurality of lug-shape pattern dots arranged in a matrix on one of two equal parts of a predetermined region defined at a center portion of the photo mask, and a plurality of depression-shape pattern dots arranged in a matrix on the other part of the predetermined region; the pattern dots in either region being made of the same material as that of the photo mask and having a size gradually varying in a vertical matrix direction and in a horizontal matrix direction. Using the photo mask, it is possible to easily and rapidly measure the development rate uniformity of the development equipment used and to achieve an easy adjustment of the development rate of the development equipment, a simplified adjustment and a reduced adjustment time.

4 Claims, 3 Drawing Sheets

PHOTO MASK PROVIDED WITH DEVELOPMENT RATE MEASURING PATTERN AND METHOD FOR MEASURING DEVELOPMENT RATE UNIFORMITY

BACKGROUND OF THE INVENTION

1. Field of the Invention

The present invention relates to a photo mask with a development rate measuring pattern for measuring development rates at different areas of a wafer after forming a photo mask pattern using photolithography for the fabrication of a semiconductor device and a method for measuring the development rate uniformity using the photo mask.

2. Description of the Prior Art

As a wafer used for fabrication of semiconductor devices becomes larger than the general size of 4 inches, for example, 5 inches, 6 inches or 8 inches, the uniformity in development rate of a photo mask pattern at all areas of the wafer, may be greatly affected where the photo mask pattern is formed using a photolithography process involving three steps: a coating and alignment of a photoresist film, an exposure and a development. In the case of the 8-inch wafer, in particular, the uniform development rate is an important factor for achieving a high integration of semiconductor devices.

For this reason, a measurement of development rate at each area of a wafer is made. For example, the development rate uniformity can be checked by measuring development rates of predetermined patterns formed on corresponding areas of the wafer by use of critical dimension measuring equipment after carrying out the general photolithography process. However, such a conventional method requires a lot of time and the use of an expensive scanning electron microscope (SEM) as the critical dimension measuring equipment.

SUMMARY OF THE INVENTION

Therefore, an object of the invention is to provide a photo mask with a development rate measuring pattern enabling easy measurement of development rates at different areas of a wafer, and to provide the method for measuring a development uniformity by use of the photo mask.

The present invention provides a photo mask comprising: a development rate measuring pattern which includes a plurality of lug-shape pattern elements arranged in a matrix on one of two equal parts of a predetermined region defined at the center of the photo mask and a plurality of depression-shape pattern elements arranged in a matrix on the other part of the predetermined region: the pattern elements in either pattern region being made of the same material as the photo mask and gradually varying in size in a vertical matrix and a horizontal matrix direction, The present invention also provides the method for measuring a development rate uniformity using a photo mask with a development rate measuring pattern wherein the development rate uniformity is determined by subtracting the minimum dimension of one of the patterns formed by the development rate measuring pattern, from the maximum dimension formed by the development rate measuring patterns.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
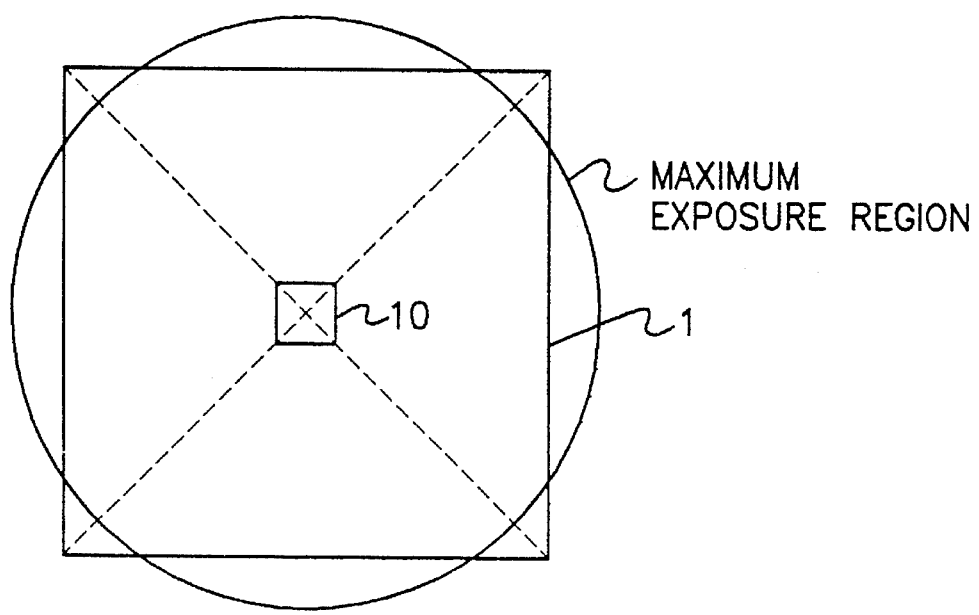
FIG. 1 is a schematic view-illustrating a maximum exposure region of the light exposure equipment wherein it overlaps with a photo mask fabricated in accordance with the present invention.

FIG. 1 is a schematic view illustrating the maximum exposure region of the light exposure equipment wherein it overlaps with a photo mask fabricated in accordance with the present invention. As shown in FIG. 1 the maximum exposure region has a circular shape such that it is equidistant with respect to the light exposure center. Due to the equidistant arrangement of the maximum exposure region, different areas in the exposure region spaced different distances from the light exposure center have different light exposure energies.

Accordingly, the pattern for the development rate must be measured at a predetermined position on the photo mask, namely, the center of the photo mask which corresponds to the center of the light exposure region.

Figure 2:
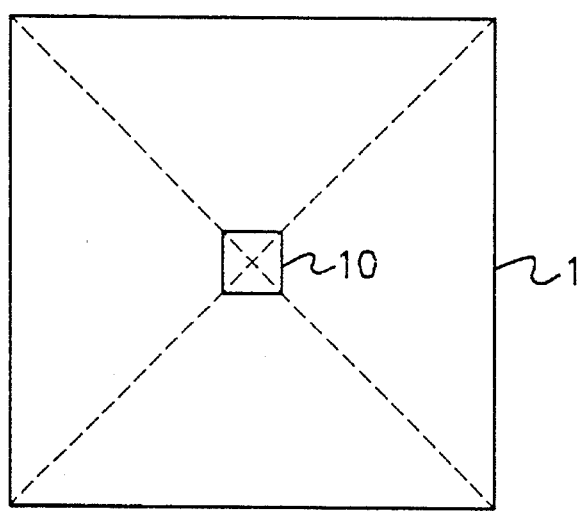
FIG. 2 is a schematic view of the photo mask provided with a development rate measuring pattern in accordance with the present invention.

FIG. 2 is a schematic view of the photo mask in accordance with the present invention. In FIG. 2, the reference numeral 1 denotes the photo mask whereas the reference numeral 10 denotes a development rate measuring pattern formed on the photo mask in accordance with the present invention.

As shown in FIG. 2, the development rate measuring pattern 10 is positioned at the center of the photo mask 1. The development rate measuring pattern 10 has a size predetermined such that both its longitudinal dimension and lateral dimension are on the order of 200 μm.

Figure 3:
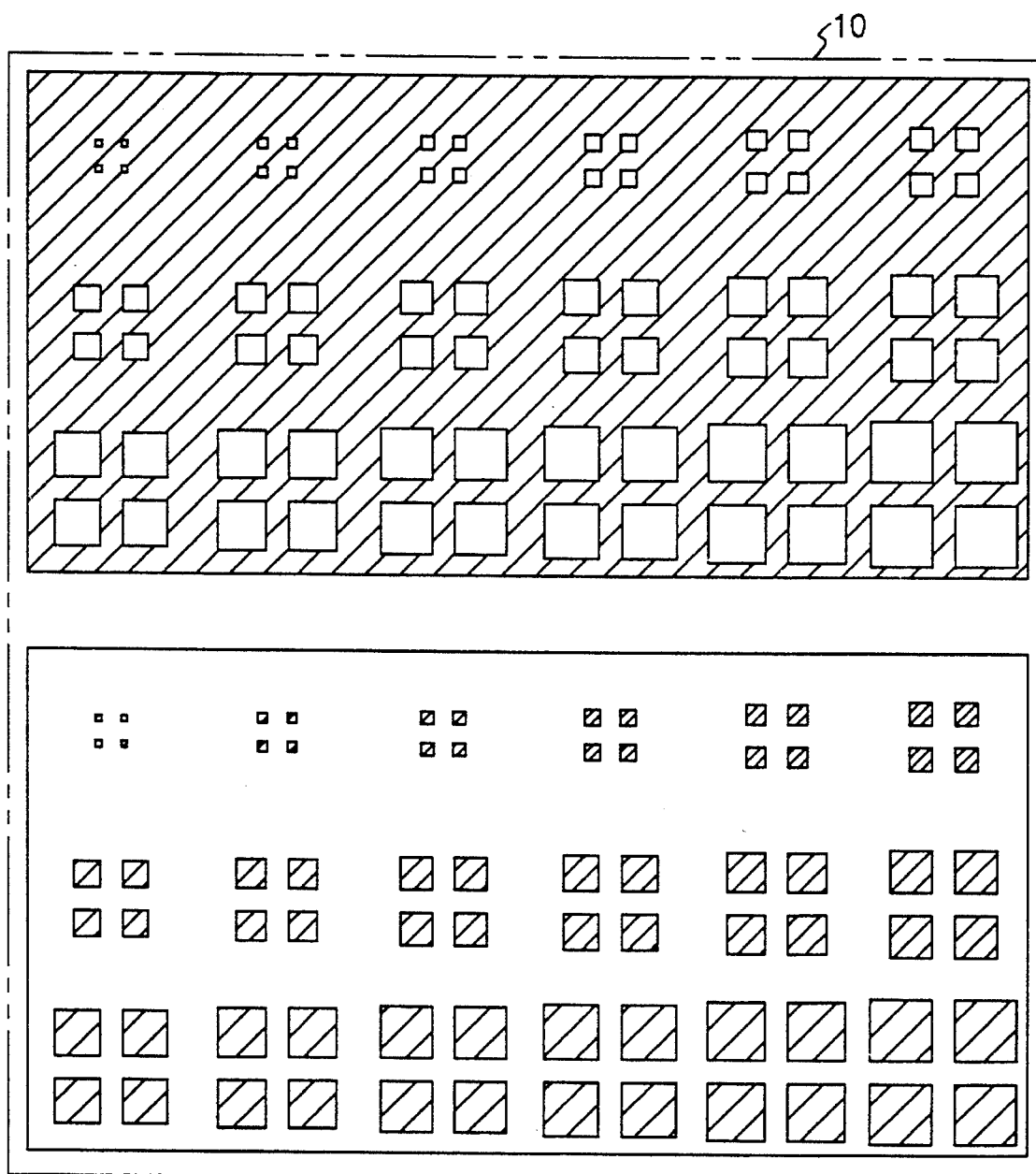
FIG. 3 is an enlarged view of the development rate measuring pattern shown in FIG. 2.

FIG. 3 is an enlarged view of the development rate measuring pattern 10 shown in FIG. 2. A method for forming the development rate measuring pattern will now be described in conjunction with FIG. 3.

In accordance with the method, a region for forming the development rate measuring pattern is determined. Thereafter, the pattern region is divided into two equal parts. On one of the parts of the pattern, a plurality of lug-shaped dots are arranged in a matrix. On the other part of the pattern, a plurality of depression-shaped dots are arranged in a matrix. The dots in either region are made of the same material as the photo mask and have dimensions gradually increasing to the right and downward, as shown in the following table. In the table, the dimensions are expressed micrometer.

TABLE

| | | | | | |
|---|---|---|---|---|---|
| 0.1 | 0.15 | 0.2 | 0.25 | 0.3 | 0.35 |
| 0.4 | 0.45 | 0.5 | 0.55 | 0.6 | 0.65 |
| 0.7 | 0.75 | 0.8 | 0.85 | 0.9 | 0.95 |

In order to measure the development rate using the development rate measuring pattern, one of the dots is selected as a reference dot. A lug-shape dot having the smallest dimension but yet not vanished is selected from those on one region. Then, a depression-shape dot having the smallest dimension is selected from those on the other region. Of the two dots, the more distinguishable is selected as the reference dot.

Figure 4:
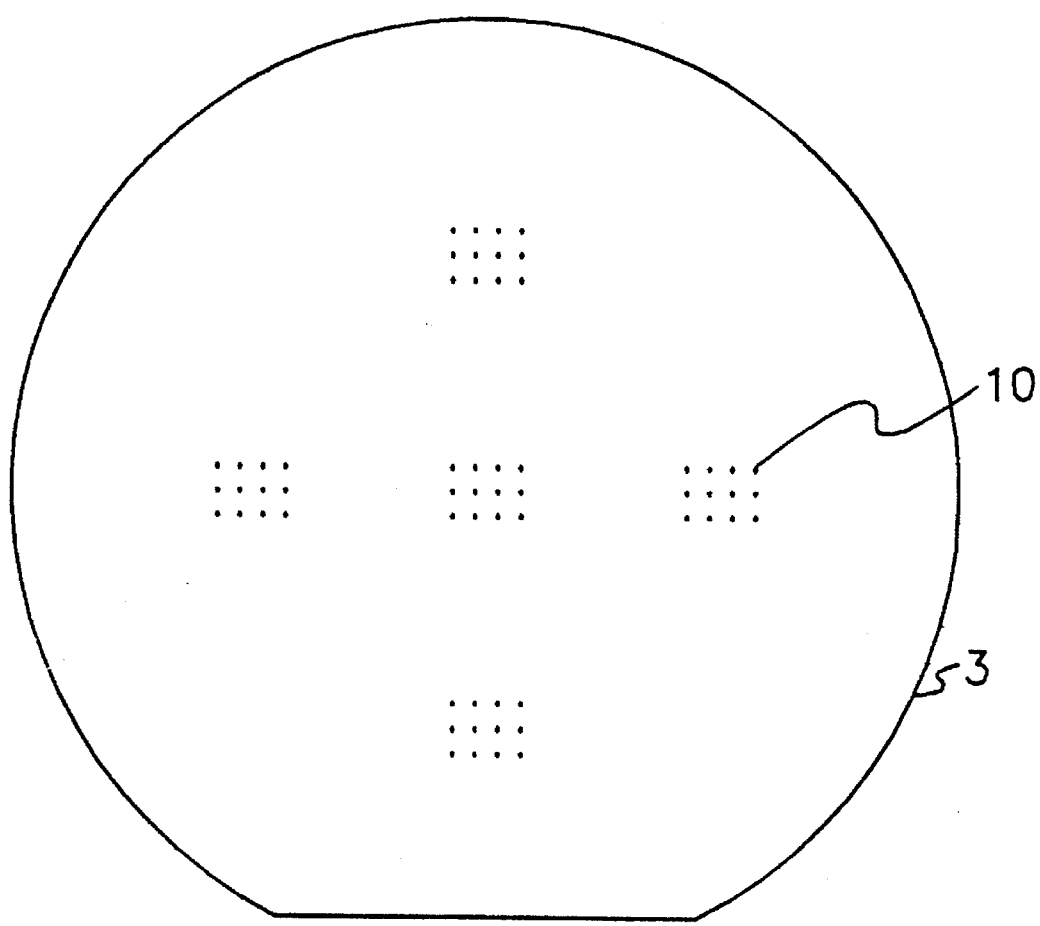
FIG. 4 illustrates a wafer with photoresist patterns formed using the photo mask with the development rate measuring pattern in accordance with the present invention.

FIG. 4 illustrates a wafer with photoresist patterns formed using the photo mask with the development rate measuring pattern formed in accordance with the above-mentioned method. The photoresist patterns 10 are obtained by exposing the wafer 3 to the development rate measuring pattern at upper, lower, left and right positions with reference to the center of the wafer and then subjecting the exposed wafer to development in development equipment.

Now, the method for measuring the development rate difference using the photo mask provided with the development rate measuring pattern will be discussed in conjunction with FIG. 4.

For example, if the dots of the lug shape are more distinguishable than those of the depression shape, reference dots for the respective photoresist patterns the formed are selected therefrom. Thereafter, the dimensions of respective reference dots are measured. Based on the measured the dimensions, a development rate uniformity is calculated. If the reference dots have dimensions of 0.75 µm at the center of the wafer, 0.65 µm in the upper pattern, 0.7 µm in the left pattern, 0.7 µm in the right pattern and 0.65 µm in the lower pattern, the development rate uniformity is 0.1 µm, the difference between 0.75 µm, the maximum value of the measured dimensions and 0.65 µm, the minimum value of the measured dimensions.

As apparent from the above description, the present invention a photo mask with a development rate measuring pattern capable of easily and rapidly measuring the development rate uniformity of development equipment. By using the photo mask in accordance with the present invention, it is possible to achieve an easy adjustment of the development rate, a simplified adjustment and a reduced adjustment time.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A photo mask comprising:
    a development rate measuring pattern including a plurality of lug shape pattern elements arranged in a matrix on one of two equal parts of a region defined at a center portion of the photo mask, and a plurality of depression-shape pattern elements arranged in a matrix on the other part of the region; the pattern elements in either region being made of the same material as the photo mask and having a size gradually varying in a vertical matrix direction and in a horizontal matrix direction.

2. A photo mask in accordance with claim 1, wherein the development rate measuring pattern has a size such that both its longitudinal dimension and its lateral dimension are 200 µm.

3. A photo mask in accordance with claim 2, wherein the pattern elements in either region have a dimension gradually increasing by 0.5 µm from a minimum dimension of 0.1 µm to a maximum dimension of 0.95 µm.

4. A method for measuring development rate uniformity using a photo mask with development rate measuring patterns, each of said patterns comprising a plurality of lug-shaped dots arranged in a first matrix and a plurality of depression-shaped dots arranged in a second matrix, said method comprising the steps of:
    using the photo mask with the development rate measuring patterns in a photolithography process to expose a wafer at center, upper, lower, left and right positions with reference to a center position of the wafer;
    developing the wafer during the photolithography process;
    selecting a reference dot from the plurality of lug-shape dots and the plurality of depression-shape dots that has a minimum dimension and is still distinct from the development rate measuring patterns at the center, upper, lower, left and right positions;
    combining said reference dots from the center, upper, lower, left and right patterns to form a group;
    calculating a development rate uniformity by subtracting the minimum dimension of said reference dots of said group from the maximum dimension of said reference dots of said group.

* * * * *